United States Patent [19]

Steierman

[11] Patent Number: 4,972,442
[45] Date of Patent: Nov. 20, 1990

[54] PHASE-LOCKED LOOP CLOCK

[75] Inventor: Herbert L. Steierman, Sunnyvale, Calif.

[73] Assignee: Northern Telecom Limited, Montreal, Canada

[21] Appl. No.: 343,620

[22] Filed: Apr. 27, 1989

[51] Int. Cl.⁵ .............................................. H03B 5/32
[52] U.S. Cl. .................................... 375/108; 331/1 A; 375/120
[58] Field of Search ....................... 375/106, 108, 120; 331/1 A, 14, 18, 25; 328/73, 120

[56] References Cited

U.S. PATENT DOCUMENTS

| | | | |
|---|---|---|---|
| 3,931,585 | 1/1976 | Barker et al. | 331/1 A |
| 4,151,485 | 4/1979 | LaFratta | 331/1 A |
| 4,466,110 | 8/1984 | Kizaki et al. | 375/108 |
| 4,519,071 | 5/1985 | Miller | 370/100 |
| 4,561,101 | 12/1985 | Pinsard et al. | 375/108 |
| 4,724,402 | 2/1988 | Ireland | 331/4 |
| 4,748,644 | 5/1988 | Silver et al. | 375/120 |

Primary Examiner—Benedict V. Safourek
Attorney, Agent, or Firm—Foley & Lardner, Schwartz, Jeffery, Schwaab, Mack, Blumenthal & Evans

[57] ABSTRACT

There is provided a phase-locked loop clock circuit being operable in a tracking mode in response to a reference signal and in a sustaining mode in the absence of a reference signal. The circuit provides a relatively stable output clock signal in either of the two modes and permits smooth switchovers from one reference signal to another in a system with multiple reference signals. The circuit further provides a stable output clock if a reference signal temporarily fails.

3 Claims, 2 Drawing Sheets

PHASE-LOCKED LOOP CLOCK

1. Field of the Invention

This invention relates to electronic timing apparatus and methods and more specifically to phase-locked loop circuits.

2. Background of the Invention

Phase-locked loop circuits have been used for many years for the purpose of generating a signal in a preferred phase relationship with another signal. Prior art phase-locked loop circuits are exemplified in U.S. Pat. No. 4,724,402 in the name of Karl Ireland granted Feb. 9, 1988, in U.S. Pat. No. 3,931,585 in the name of Barker et al. granted Jan. 6, 1976 and in U.S. Pat. No. 4,748,644 in the name of Robert T. Silver et al. granted May 31, 1988. In telephony systems it is often required to have a local clock follow a primary master clock in a preferred phase relationship provided by a larger, often remote, network. For example in U.S. Pat. No. 4,519,071 for "Phase-Locked Loop and Clock Circuit For A Line Switch", issued May 21, 1985 to Miller, a phase-locked loop circuit permits clock signals which are generated in a line switch module to be in phase synchronism with any one of a number of PCM lines.

Phase-locked loop circuits are often used in clock circuits in the receivers of digital signals for the purpose of generating a local clock signal phase aligned with an incoming reference signal. The phase-locked loop (PLL) circuit within the receiver can adjust its local clock signal in frequency to a multiple of the frequency of the reference signal provided by a transmitting device and as a consequence of this phase adjustment phase aligns these two signals together. Once this phase alignment has occurred and the phase relationship between the reference signal and the local clock signal is referred to as being locked, the receiver may receive synchronous data sent by the transmitter.

In most telephony systems in order to receive and capture transmitted data referenced to the transmitter's clock signal, it is necessary for the receiver to have a clock signal which is synchronized or phase aligned to the same clock signal. Although synchronization can be achieved with a single reference signal many telephony systems where reliability requirements are high, accommodate multiple reference signals (called primary and secondary references) providing redundancy in the system in the event of primary reference signal failure.

In operation, the PLL circuit phase aligns the local clock signal to the primary reference signal while any other reference signal is in a secondary or standby mode for selection.

Many time domain digital signal communication systems employ a detection mechanism to verify the integrity of a selected primary reference signal. A simple comparator circuit may be implemented to detect a lost or faulty primary reference signal which would result in the selection of the secondary reference signal to replace the lost or faulty signal, thereby changing the status of the signal. Although switching between primary and secondary reference signals is a relatively simple task, a design for providing a transparent clock switchover, that is one which does not add or delete clock cycles during the switchover functions has not simply or conveniently been achieved. In a communications system this ideal type of transparent clock switchover is referred to as a "hitless clock switchover". The communications system maintains its integrity during the switchover from one reference to another and the transmission and reception of data during the switchover period is not jeopardized during a hitless clock switchover. For example in a communications system where the transmitter and receiver are respectively transmitting and receiving data, and the receiver detects a faulty primary reference signal, it would typically switch over to a secondary reference signal. During the switchover the receiver should maintain the integrity of the local clock signal which should ideally be undisturbed in spite of the reference signals having been changed. The frequency of the local clock signal in the receiver should not increase or decrease during the interval of switching reference clock signals. In the past, in communications systems, a slight variation in the frequency of a local clock signal would not have had catastrophic effects, however an incumbent telephone user may have noticed some noise introduced in the conversation due to incorrect sampling and missed bits. When data is being transmitted through the telephone system, preserving the integrity of the data is critical. In the event of a detection error in a data transmission, at least one retransmission of the data is required. More recently in all digital networks, signal channel transmission speeds of up to 64 Kbs have become available, at corresponding billing rates, of course. In this environment noise may significantly extend a long distance call duration required for a moderate or high speed data transfer, particularly if several switching facilities are traversed If such occurs the customer may be billed in excess of what would be expected had the detection errors been avoided by more precise phase synchronization of clock signals.

A commonly known technique for hitless clock switchover uses a phase-locked loop (PLL) circuit. A well known feature of a PLL circuit is its memory of frequency and phase with respect to the incoming reference signal. For example if a reference signal is removed from the PLL circuit, the output signal will desirably follow the same frequency pattern as it had in the recent past. After some time however the output signal will drift and the frequency of the output signal will change. If the output signal drifts significantly a hitless clock switchover will not be attained. The invention disclosed addresses the problem of extending the aforementioned feature of a PLL circuit, its memory of phase and frequency, lessening the urgency to quickly switch reference signals when an error has been detected, and thus providing a means to achieve hitless clock switchovers.

SUMMARY OF THE INVENTION

The invention provides a method of generating a clock signal in a phase-locked loop circuit, the clock signal having a frequency being variable between predetermined limits. The method comprises the steps of determining a valid reference signal as being available for operation of the circuit and operating the circuit in a tracking mode wherein the clock signal is phase-locked with the reference signal. A subsequent absence of the valid reference signal is determined and the circuit functions in the maintaining mode of operation wherein the rate of change of frequency of the clock signal tends toward zero.

An object of this invention is to provide an improved clock circuit for generating an output clock signal, the frequency of which tends to be relatively stable throughout an operating regime which from time to time may include a switchover from one reference signal to another wherein the time to complete the switchover may be an indefinite period of time during which the output clock signal is generated without tracking any reference signal.

According to one aspect of the invention a phase-locked loop clock circuit is operable in a tracking mode in response to a reference signal, and in a sustaining mode in an absence of the reference signal, for providing a clock signal having a frequency which is variable between predetermined limits. The circuit includes a governable oscillating means for providing the clock signal in response to a first control signal. A scaling means divides the frequency of the clock signal to produce a scaled signal having a predetermined frequency relationship with the clock signal. A difference circuit determines a phase difference between the scaled signal and the reference signal and provides a second control signal having a duty cycle related to the phase difference therebetween in the tracking mode of operation, and the difference circuit provides the second control signal having an even duty cycle, in the sustaining mode of operation. An integrating means is responsive to the second control signal for producing the first control signal.

According to another aspect of this invention there is provided a method of maintaining the frequency of a clock signal in a phase-locked loop circuit between predetermined limits, the phase-locked loop circuit being operable in a tracking mode in response to a reference signal, and in a sustaining mode in an absence of the reference signal. The method includes the steps of generating the clock signal in response to a first control signal. The frequency of the clock signal is scaled to obtain a scaled output signal having a predetermined frequency relationship with the clock signal. In the tracking mode of operation, a second control signal having a duty cycle related to the phase difference between the scaled signal and the reference signal is provided. In the sustaining mode of operation the second control signal is provided with an even duty cycle. The second control signal is integrated for producing the first control signal.

BRIEF DESCRIPTION OF THE DRAWINGS

An embodiment of the invention is discussed with reference to the accompanying drawings in which:

Referring now to the prior art circuit of FIG. 1, a governable oscillator 14 provides a local clock signal for use by electronic circuitry. The output signal is scaled using a divide-by-N circuit 16 and the scaled signal is fed back to a phase detector circuit 12. Typically a phase detector may be implemented using an EXCLUSIVE-OR-gate and a JK flip-flop wherein the output signal of the EXCLUSIVE-OR-gate is a logic zero when the two input signals have the same frequency and zero phase difference. The JK flip-flop latches any error signal representing a phase difference in the input signals. The circuit 12 is connected to a reference signal source and compares the reference signal with the feedback scaled local clock signal to deduce the phase relationship and provides a related output signal to a loop filter 24. If the phase detector circuit determines the two signals compared to be out of phase by an amount exceeding predetermined acceptable limits, a control signal is asserted indicating a fault condition to a microprocessor. Similarly the control signal is asserted in the event of a total or intermittent loss of the primary reference signal. Typically the microprocessor responds to a fault by switching reference clocks. During the switchover period the frequency and phase of the local clock could remain constant, however, depending on response time of the PLL, clock cycles may be added or deleted as compared with the clock signal prior to switchover thus corrupting data transmission. FIG. 2 illustrates an embodiment of the present invention. A multiplexer 10 is connected to a terminal Y and is responsive to microprocessor control signals for selecting one of a plurality of input reference signals for providing a primary reference signal. A first JK flip-flop 18 is connected to the terminal Y and is responsive to the primary reference signal. The JK flip-flop 18 is connected to an error detector 26 via a terminal T3 and provides a signal SQ1 on an output terminal T1. An EXCLUSIVE-OR gate 22 receives a signal SQ2 and the signal SQ1 on a terminal T2 and the terminal T1 respectively for providing an output signal SQ1EXQ2. A loop filter 24 is responsive to the signal SQ1EXQ2 and provides a voltage signal SDC corresponding to the DC component of the signal SQ1EXQ2. A voltage controlled crystal oscillator 14 responsive to the signal SDC provides a local clock signal having a frequency in dependence upon the voltage of the signal SDC. A divide-by-N circuit 16 responsive to the local clock signal provides a scaled signal in dependence upon the frequency of the local clock signal and a predetermined scalar value N, the frequency of the scaled signal being a submultiple of the frequency of the local clock signal such that the frequency of the local clock signal divided by N is equal to the frequency of the primary reference signal. A phase error detector 26 responsive to the primary reference signal, the scaled signal, and a second microprocessor control signal is adapted to provide a diagnostic signal D1 which is asserted to represent an error condition on terminal T3. A second JK flip-flop 20 responsive to the scaled signal provides the signal SQ2 on the terminal T2.

Figure 1:
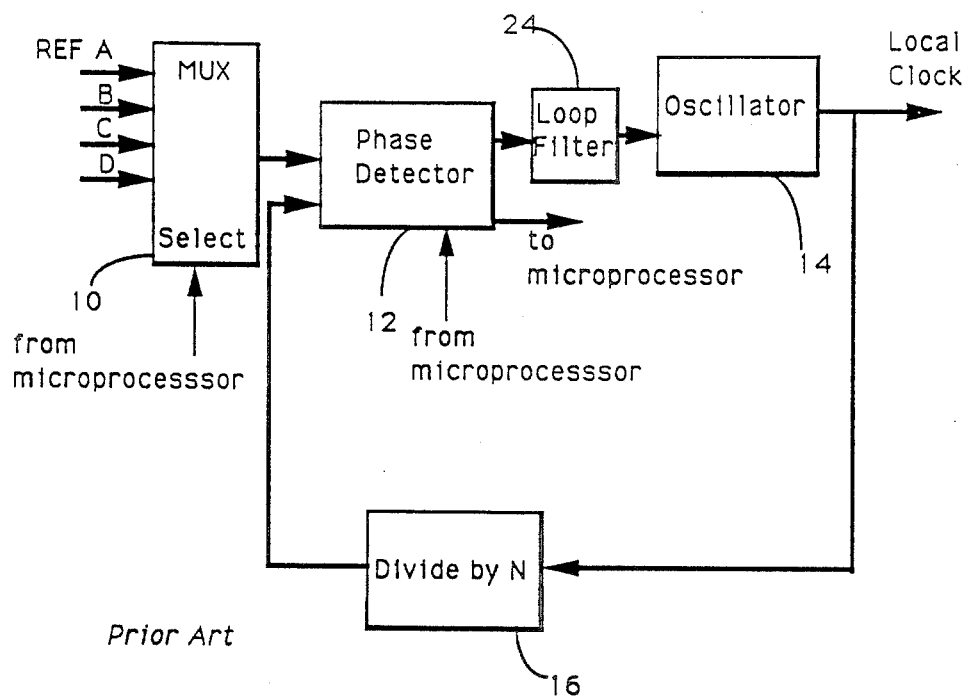
FIG. 1 is a block diagram of a typical prior art phase-locked loop clock circuit.
Figure 2:
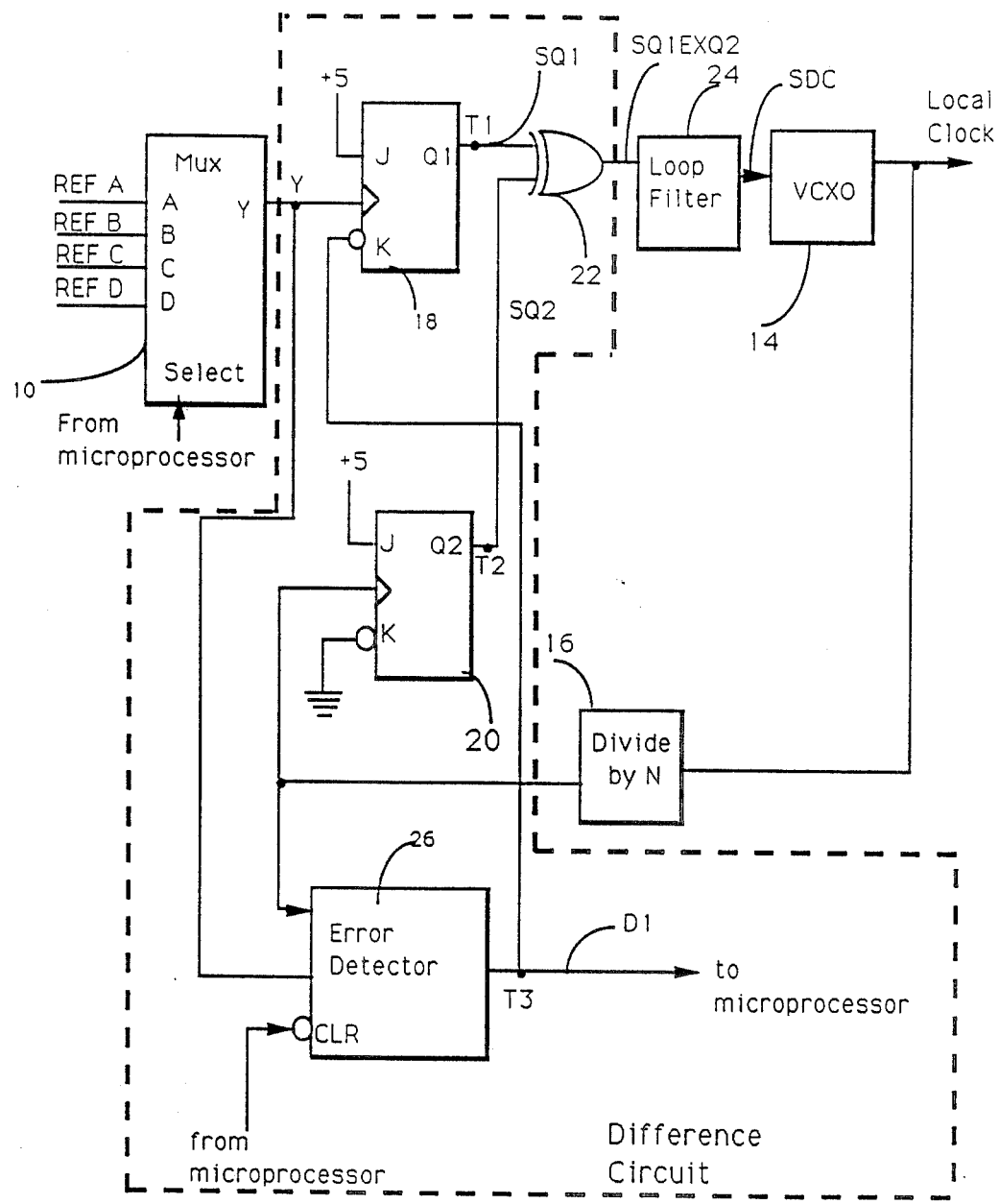
FIG. 2 is a schematic block diagram of a phase-locked loop clock circuit in accordance with the invention.

In operation the circuit in FIG. 2 performs in three modes. In the first mode of operation upon power up of the circuit, the phase-locked loop is in an unlocked state which is indicated by the signal D1 having a predetermined logic value representative of an error condition. The microprocessor then simultaneously selects (via the multiplexer 10) a suitable clock reference source and asserts a clear error signal to the error detector 26 for clearing the error condition indicated by signal D1. After a predetermined period of time, as determined by the characteristics of the loop filter, the phase-locked loop will be in a locked state wherein the primary reference signal and the scaled local clock signal have similar frequency and phase, varying within predetermined acceptable limits, and the clear error signal is removed. Upon removal of the clear error signal, the signal D1 indicates the true phase-locked loop status. If the true phase-locked loop status indicates no error detected by the error detector 26, then the second mode of operation follows, otherwise the third mode of operation ensues. The second mode of operation occurs when the error detector 26 receives the second microprocessor control signal indicating no errors. In this mode error detection resumes. As the phase-locked loop reaches equilibrium, during error free operation, the signal SQ1, having a duty cycle of approximately 50 percent, corresponds in frequency to the primary reference signal and the signal SQ2 also having a duty cycle of approximately 50 percent, corresponds in frequency to the signal SQ1, however shifted in phase by 90 degrees. The EXCLUSIVE-OR gate 22 responsive to the phase relationship of the signals SQ1 and SQ2 being 90 degrees out of phase, provides the signal SQ1EXQ2 which is approximately a 50 percent duty cycle signal. Before the PLL has stabilized the signal SQ1EXSQ2 will not have a near 50 percent duty cycle as the signals SQ1 and SQ2 will not yet be 90 degrees out of phase, and the voltage controlled oscillator will increase or decrease in frequency in dependence upon the skew of the duty cycle of the signal SQ1EXSQ2. When the phase-locked loop has been running for some time and has stabilized in a state of equilibrium, the DC component of the output signal of the EXCLUSIVE-OR gate 22 will represent a near zero degree phase error signal to the PLL. This second mode of operation is referred to as a tracking mode in which the phase-locked loop tracks or follows the incoming reference signal, producing an output signal which reflects the recent frequency changes of the incoming reference signal. In the tracking mode the phase-locked loop maintains a relatively fixed phase relationship between the selected reference signal and the voltage controlled oscillator output signal. The third mode of operation occurs when an error is detected. The signal D1 having a logic value which is predetermined and representative of an error condition, performs the dual function of alerting the microprocessor that an error has occurred, and sets the JK flip-flop 18 in a mode whereby its output signal SQ1 represents a constant logic value (not representative of the primary reference signal). When the signal SQ1 represents a constant logic value (due to an error condition), the signal SQ2 having a nearly 50 percent duty cycle, cycles through the EXCLUSIVE-OR gate 22 and will provide a stable signal to the voltage controlled oscillator 14 via the loop filter 24. The loop filter 24 integrates the input signal SQ1EXSQ2. This signal having an average duty cycle of approximately 50 percent results in a near constant output signal after integration within the loop filter. This near constant output signal SDC does not necessarily have a voltage which corresponds to the midpoint input voltage of the voltage controlled oscillator. The near constant output signal SDC is a voltage signal representative of a state of equilibrium in the phase-locked loop. This stable signal SDC is maintained until a new reference signal has been selected. This third mode of operation is referred to as a sustaining mode of operation. The effect of cycling the signal SQ2 through the EXCLUSIVE-OR gate 22 is to maintain the phase-locked loop in a relatively stable state rather than trying to lock to a faulty incoming reference. The sustaining mode is a transitory mode of operation. After a new reference signal has been selected replacing a faulty reference signal the first mode of operation begins followed by the second or tracking mode of operation. The degree to which the "near equilibrium" state can be achieved is a function of the quality and selection process that is used when choosing components. For example, the rise and fall times of the reference signal and the scaled local clock signal may conveniently be matched by providing logic gates 18 and 20 within the same integrated circuit package. Selection of other components such as the voltage controlled oscillator must also meet the requirements and specifications of output clock signal. For example if the desired output clock signal must be within 50 parts per million (ppm) accuracy, then it would be desirable to choose a voltage controlled oscillator having a tuning range of approximately $+-150$ ppm.

What is claimed is:

1. A phase locked loop clock circuit being operable in a tracking mode in response to a reference signal, and in a sustaining mode in an absence of said reference signal, for providing a clock signal having a clock frequency varying between predetermined limits, the circuit comprising:

a governable oscillating means for providing the clock signal in response to a first control signal;

a scaling means for dividing the frequency of the clock signal, to produce a scaled signal having a predetermined frequency relationship with the clock signal;

a difference circuit for determining a phase difference between the scaled signal and the reference signal, for providing a second control signal having a duty cycle related to a phase difference therebetween, in the tracking mode of operation and the difference circuit including exclusive-oring means responsive to a constant voltage signal and the scaled signal for providing the second control signal with an even duty cycle in the sustaining mode of operation, the constant voltage signal being representative of a detected phase difference between the reference signal and the scaled signal; and an integrating means responsive to the second control signal for producing the first control signal.

2. A method of maintaining the frequency of a clock signal in a phase locked loop circuit between predetermined limits, the phase locked loop circuit being operable in a tracking mode in response to a reference signal, and in a sustaining mode in an absence of the reference signal, said method comprising the steps of:

generating the clock signal in response to a first control signal;

scaling the frequency of the clock signal to yield a scaled output signal having a predetermined frequency relationship with the clock signal;

in the tracking mode of operation providing a second control signal having a duty cycle related to a phase difference between the scaled signal and the reference signal;

integrating the second control signal to provide the first control signal; and exclusive-oring a constant voltage signal with the scaled output signal to provide the second control with an even duty cycle in the sustaining mode of operation.

3. A method of generating a clock signal in a phase locked loop circuit, the clock signal having a frequency being variable between predetermined limits, the method comprising the steps of:

determining a valid reference signal as being available for operation of the circuit, and operating the circuit in a tracking mode wherein the clock signal is phase locked with the reference signal;

determining subsequent absence of the valid reference signal, and operating the circuit in a sustaining mode wherein the rate of change of frequency of the clock signal tends toward zero, and wherein operation in the tracking mode includes the steps of:

scaling the clock signal to yield a scaled signal having a 50% duty cycle;

generating a second control signal having a duty cycle related to an instantaneous phase relationship between the reference signal and the scaled signal, wherein the step of generating the second control signal in the tracking mode includes exclusive-oring the reference signal and the scaled signal;

wherein operating in the sustaining mode includes the steps of:

scaling samples of the clock signal to yield a scaled signal;

generating the second control signal having a duty cycle corresponding to the duty cycle of the scaled signal, and wherein the step of generating the second control signal in the sustaining mode includes exclusive-oring the scaled signal and one of high and low binary signal states.

* * * * *